United States Patent [19]
Scherer

[11] Patent Number: 5,790,959
[45] Date of Patent: Aug. 4, 1998

[54] PROGRAMMABLE BAND SELECT AND TRANSFER MODULE FOR LOCAL MULTIPOINT DISTRIBUTION SERVICE BASESTATION

[75] Inventor: Dieter Scherer, Palo Alto, Calif.

[73] Assignee: Hewlett-Packard Company, Palo Alto, Calif.

[21] Appl. No.: 747,082

[22] Filed: Nov. 13, 1996

[51] Int. Cl.$^6$ .................................................. H04B 1/04
[52] U.S. Cl. ......................... 455/561; 455/114; 455/118; 455/307; 455/314
[58] Field of Search ........................... 455/17, 19, 20, 455/23, 25, 561, 118, 307, 84, 86, 78, 115, 114, 314, 21, 22, 112, 11.1, 73, 76, 102, 103

[56] References Cited

U.S. PATENT DOCUMENTS

| | | | |
|---|---|---|---|
| 2,671,850 | 3/1954 | Marcou | 455/22 |
| 3,310,740 | 3/1967 | Leysieffer | 455/22 |
| 5,115,514 | 5/1992 | Leslie | 455/17 |
| 5,613,234 | 3/1997 | Vella-Coleiro | 455/307 |

FOREIGN PATENT DOCUMENTS 6181452  6/1994  Japan ........................ 455/25

Primary Examiner—Nguyen Vo
Assistant Examiner—Doris To
Attorney, Agent, or Firm—John L. Imperato

[57] ABSTRACT

Transmit and receive programmable band select/transfer modules provide low cost means for selecting and translating spectral segments within sectors of a LMDS basestation. The modules are programmable to select spectral segments and translate the frequency of the selected segments to designated spectral positions in the sector's output signal. Each module shifts the frequency of an applied uwave signal to dispose a predetermined spectral segment about an IF frequency. The predetermined spectral segment is then selected using a fixed frequency filter at the IF frequency. The spectral segment has one of several bandwidths, selected by one of multiple fixed frequency filters in the modules. The module translates the frequency of the filtered spectral segment to dispose the selected spectral segment about an output frequency to provide the sector's output signal. An optional pilot signal or service channel may be summed with the filtered spectral segment prior to the frequency translation.

10 Claims, 4 Drawing Sheets

PROGRAMMABLE BAND SELECT AND TRANSFER MODULE FOR LOCAL MULTIPOINT DISTRIBUTION SERVICE BASESTATION

FIELD OF THE INVENTION

The present invention relates to Local Multipoint Distribution Service (LMDS) basestations and, more particularly, to programmable modules within basestations that select spectral segments from input signals and translate the frequency of the spectral segments to designated spectral positions in output signals.

BACKGROUND OF THE INVENTION

Local Multipoint Distribution Service (LMDS) provides wireless access to the information superhighway. Spectra allocated in the millimeter wave (mmwave) frequency range provide a wireless link between basestations and remote subscribers within the service. Basestations contain multiple sectors which interface to a headend coupled to the information superhighway. In a transmit mode, a sector receives a transmitted microwave (uwave) signal from the headend and produces an output signal that is then upconverted to form a transmitted mmwave signal. In a receive mode, the sector receives a received uwave signal from a downconverted mmwave signal and produces an output signal that is applied to the headend. In both the transmit and receive modes, the sector filters the uwave signals to select a designated spectral segment from multiple spectral segments or frequency bands within the uwave signal. The sector then translates the frequency of the selected segment into a desired spectral position in the output signal. Typically, the transmit and receive modes operate simultaneously within each of the multiple sectors of the basestation.

Filtering the uwave signals received by the sector is a difficult task using presently available filters. Tuneable filters have passbands that are swept over the frequency range of the applied uwave signal to align with a spectral segment of the signal to be selected. These filters, typically Yttrium-Indium-Garnett (YIG) or varacter tuned filters, are not well suited for selecting the spectral segments from the uwave signals applied to a sector. Frequency response characteristics, such as amplitude flatness, group delay and tuning speed are limited by the tuning elements in the filters and degrade the performance of the sectors in a LMDS basestation. Microwave switched filters may be optimized for frequency response characteristics and switching speed, but these switched filters are expensive. Both tuneable and switched filters have predefined bandwidths and frequency operating ranges which are not readily adaptable to flexible performance requirements of LMDS, such as selection of spectral segments having different bandwidths and accommodation of received uwave signals having variable frequency ranges.

SUMMARY OF THE INVENTION

Transmit and receive programmable band select/transfer modules are included within each sector of a LMDS basestation. Each module is programmable to select a particular spectral segment from a uwave signal applied to the module and is also programmable to translate the frequency of the spectral segment to a designated spectral position at the sector's output. Selection of a spectral segment having one of several bandwidths and accommodation of uwave signals having varying frequency ranges are readily achieved using the modules.

In accordance with a first preferred embodiment of the present invention, a transmit programmable band select/transfer module (tPST) within a sector receives a transmitted microwave (uwave) IF signal from a headend. The tPST is programmed to filter a particular spectral segment from this uwave IF signal and to translate the frequency of the spectral segment into an independently programmed spectral position to form the tPST's output signal. This output signal is then upconverted to provide a transmitted mmwave signal that is transmitted to subscribers. An optional pilot signal may be attached to the tPST's output signal.

In accordance with a second preferred embodiment of the present invention, a receive programmable band select/transfer module (rPST) within a sector receives a uwave signal from a downconverted mmwave signal. The rPST is programmed to filter a particular spectral segment from the uwave signal and to translate the frequency of the spectral segment into an independently programmed spectral position to form the rPST's output signal. This output signal combines with output signals from rPST's of other sectors in the basestation to provide a receive uwave IF signal that is applied to the headend.

The rPST and tPST modules each select a spectral segment from an applied uwave signal by first shifting the frequency of the uwave signal so that the spectral segment programmed to be selected is disposed about a predetermined IF frequency. Once shifted to the IF frequency the spectral segment is selected by filtering the frequency shifted uwave signal using one of multiple fixed frequency filters. These filters have frequency responses optimized for selecting spectral segments. Each of the multiple fixed frequency filters has a different bandwidth, enabling spectral segments of various bandwidths to be selected by alternately switching between the multiple filters. The selected spectral segment is then translated in frequency to a programmed spectral position in the modules' output signals. The modules provide a low cost solution for programmable selection and translation of spectral segments within sectors of a LMDS basestation.

DETAILED DESCRIPTION OF THE PREFERRED EMBODIMENT

Figure 1:
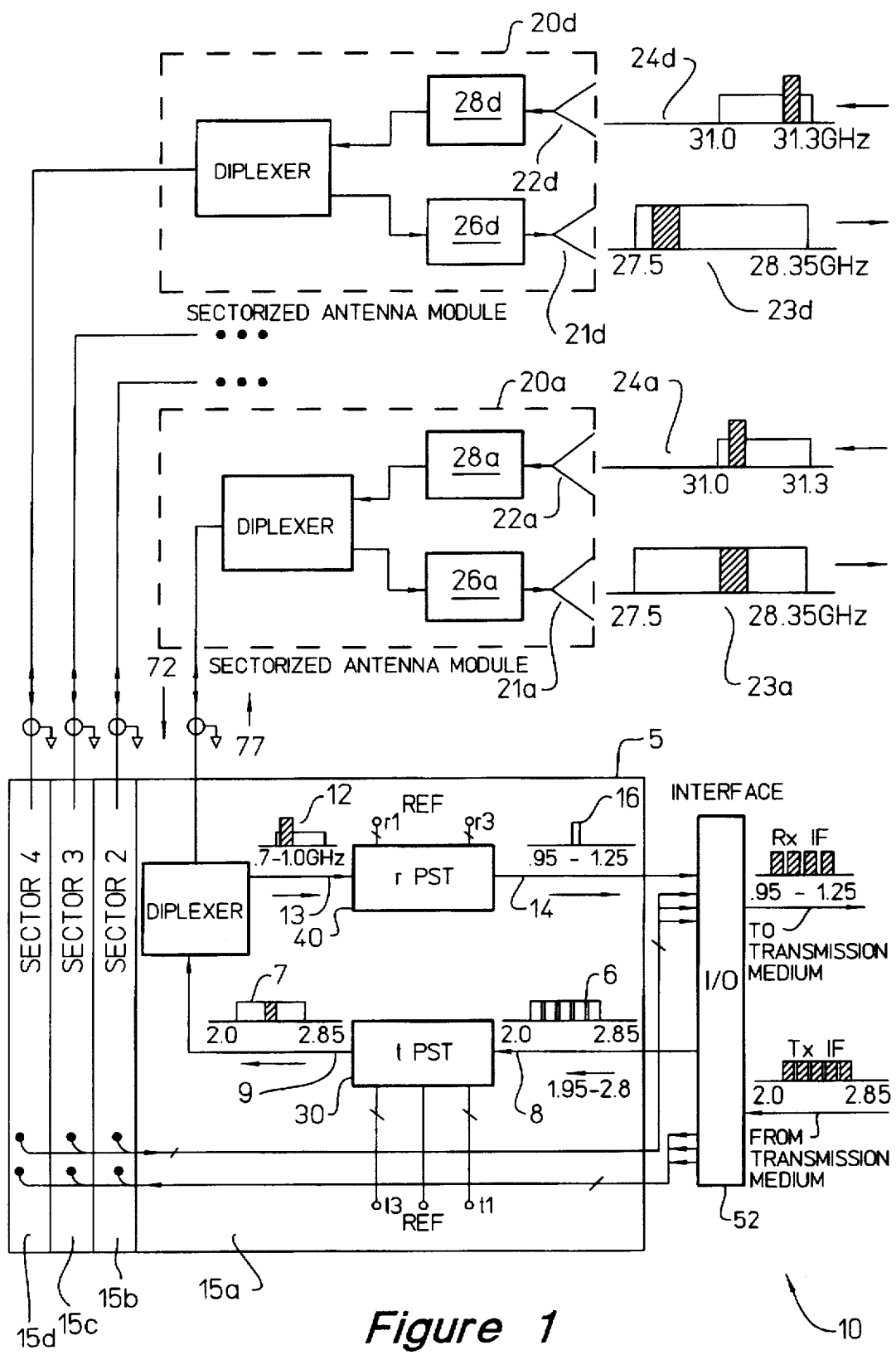
FIG. 1 shows a basestation of a Local Multipoint Distribution Service (LMDS) including transmit and receive programmable band select/transfer modules constructed according to preferred embodiments of the present invention.

FIG. 1 shows a basestation 10 of a Local Multipoint Distribution Service (LMDS) including a transmit programmable band select/transfer module (tPST) 30 and receive programmable band select/transfer module (rPST) 40 constructed according to the preferred embodiments of the present invention. The basestation has a basemodule 5, typically located indoors or on the ground, and sectorized antenna modules 20a, 20d typically located on a mast top or rooftop of a building. Each of the sectorized antenna modules 20a, 20d (two shown) corresponds to each of multiple sectors 15a–15d within the basemodule 5. The sectorized antenna modules 20a, 20d provide the wireless link between subscribers (not shown) and the basemodule 5. The functional elements of one of the sectors 15a is shown. Typically, each of the sectors 15a–15d has identical functional elements. The basemodule, in turn, connects through an interface 12 to the transmission medium of the information superhighway at a headend (not shown).

Separate spectra in the millimeter wave (mmwave) frequency range are allotted for the signals linking transmit antennae 21a, 21d and receive antennae 22a, 22d to subscribers. In this example, transmitted mmwave signals 23a, 23d (spectra shown) linking the basestation 10 to the subscribers in a downstream path 77 occupies the 27.5 to 28.35 GHz frequency range. Received mmwave signals 24a, 24d (spectra shown) link the subscribers to the basemodule 5 in an upstream path 72 and occupy the 31 to 31.3 GHz frequency range.

In the downstream path 77, the transmitted mmwave signal 23a is generated from a downstream uwave signal 7 (spectrum shown) in the 2.0 to 2.85 GHz frequency range provided by an output 9 of the tPST 30 within a corresponding sector 15a in the basemodule 5. The downstream uwave signal 7 is applied to an upconverter 26a in the sectorized antenna module 20a. The upconverter 26a produces the transmitted mmwave signal 23a from the downstream uwave signal 7, that is applied to the transmit antenna 21a corresponding to the sector 15a. The downstream uwave signal 7 provided by the tPST 30 is generated by processing a transmitted uwave IF signal 6 provided to an input 8 of the tPST 30 by the interface 12 from the transmission medium of the information superhighway. The transmission medium in this example is optical fiber and the interface 12 is an optical to electrical converter (O/E) that converts a modulated optical signal TxIF into the transmitted uwave IF signal 6 applied to an input 8 of the tPST 30.

In the upstream path 72, the received mmwave signal 24a is incident on a receive antenna 22a and applied to a downconverter 28a which produces from the received mmwave signal 24a, an upstream uwave signal 12 (spectrum shown) in the 0.70 to 1.0 GHz frequency range. The downconverter 28a is located in the sectorized antenna module 20a and coupled to the receive antenna 22a. The upstream uwave signal 12 is applied to an input 13 of a rPST 40 within the sector 15a that corresponds to the receive antenna 22a. The rPST 40 processes the upstream uwave signal 12 to generate a received uwave IF signal 16 at the output 14 of the rPST 40 that is applied to interface 12. The interface then combines the received uwave IF signal 16 with received IF uwave signals from other sectors 15b–15d in the basemodule 5 and converts the combined signal into a modulated optical signal RxIF that is delivered to the transmission medium.

Figure 2:
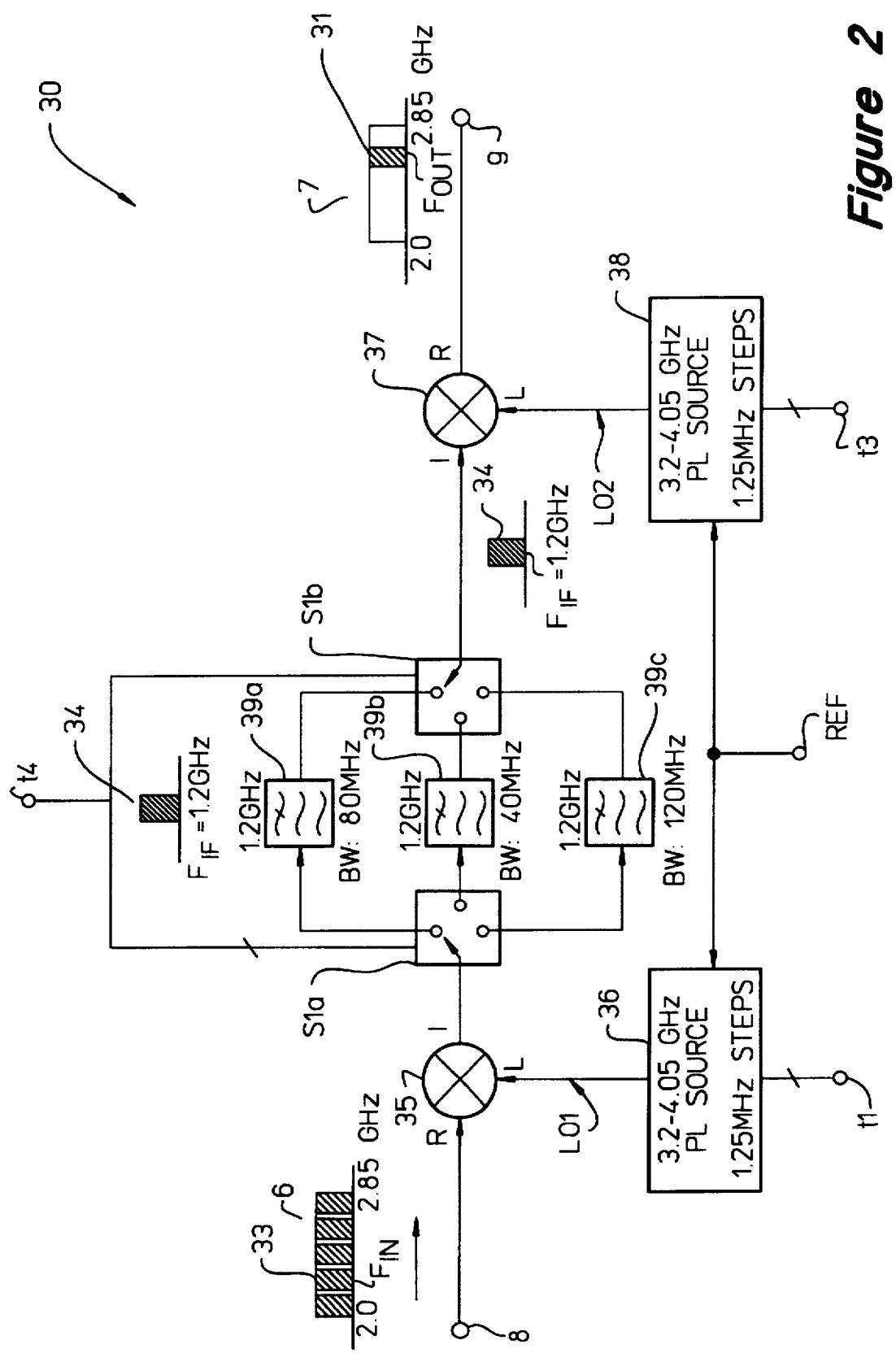
FIG. 2 shows a transmit programmable band select/transfer module (tPST) constructed according to a first preferred embodiment of the present invention.

FIG. 2 shows a transmit programmable band select/transfer module 30 (tPST) constructed according to the first preferred embodiment of the present invention. The transmitted uwave IF signal 6 (spectrum shown) is applied to the input 8 of the tPST 30 from the interface 12 (not shown). In this example, the transmitted uwave IF signal 6 has an 850 MHz bandwidth (2.0–2.85 GHz) corresponding to the 850 MHz bandwidth of the transmitted mmwave signal 23a (27.5–28.35 GHz) and may contain 21 optical carrier (OC1) bands, each 40 MHz wide. Typically, only a few of the 21 OC1 bands are transmitted at each basestation 10, while the remainder of the bands are designated for transmission by other basestations in the LMDS. A tPST 30 within a sector 15a of a basestation 10 may, for example, transmit only one OC1 band. The tPST 30 within a sector 15a selects the particular OC1 band 33 from the applied transmit uwave IF signal 6 and then translates the frequency of the OC1 band 33 to a designated spectral position 31 in the downstream uwave signal 7 (spectrum shown) at the tPST's output 9. The relative spectral position of the selected OC1 band 31 in the downstream uwave signal 7 provided by the tPST 30 is maintained after the downstream uwave signal 7 is upconverted to produce the transmitted mmwave signal 23a.

In order to produce the downstream uwave signal 7, the tPST 30 selects a spectral segment from the transmit uwave IF signal 6. The spectral position of the spectral segment or OC1 band 33 to be selected is disposed about a frequency $F_{IN}$. A first local oscillator signal LO1 is applied to the L port of the input mixer 35. The signal LO1 is generated from an input local oscillator 36 that is programmed in frequency via control port t1 to produce an output frequency $Ft_{LO1}$ that is offset from the input frequency $F_{IN}$ by a predetermined IF frequency, $F_{IF}$. For example, if the input frequency $F_{IN}$ about which the spectral segment is disposed is 2.3 GHz and the predetermined IF frequency $F_{IF}$=1.2 GHz, then the input local oscillator 36 will be tuned to an oscillator frequency $Ft_{LO1}=F_{IN}+F_{IF}$=3.5 GHz. At an I port of the input mixer 35, the spectral segment 33 which is disposed about input frequency $F_{IN}$ is shifted down in frequency to the predetermined IF frequency $F_{IF}$, which in this example is 1.2 GHz. Thus, the spectral segment 33 becomes disposed about the predetermined IF frequency $F_{IF}$. The shifted uwave IF signal is then applied to one of multiple band selection filters 39a, 39b, 39c, chosen via control port t4 which actuates switches S1a, S1b. In this example, one, two or three OC1 bands are passed by the band selection filters 39b, 39a, 39d, respectively. The choice of bandwidths permits selection of 40 MHz, 80 MHz or 120 MHz wide spectral segments corresponding to the one, two or three OC1 bands. Since the filtering takes place at this fixed predetermined IF frequency $F_{IF}$, the filters 39a, 39b, 39c can be optimized for selectivity, group delay and amplitude flatness. The frequency shifted spectral segment 34 selected by one of the filters 39a, 39b, 39c is then applied to an I port of an output mixer 37. A second local oscillator signal LO2 is generated from an output local oscillator 38 that is programmed in frequency via control port t3, to produce an oscillator frequency $Ft_{LO2}$. The local oscillator signal LO2 is applied to the L port of the output mixer 37. At an R port of the output mixer 37, the shifted spectral segment 34 is translated to a designated spectral position in the transmit uwave signal 7 at the tPST output 9. The spectral segment 33 of the applied transmitted uwave IF signal 6 originally disposed about input frequency $F_{IN}$ is transferred to a spectral position $F_{OUT}$ in the downstream uwave signal 7 at the output 9 of the tPST 30. To translate the spectral segment 33 from a position $F_{IN}$ to a spectral position $F_{OUT}$, the frequencies of the input local oscillator 36 and output local oscillator 38 are programmed according to the following equation:

$$F_{OUT}=F_{IN}+(Ft_{LO2}-Ft_{LO1}).$$

In this example, the frequency range (2.0–2.85 GHz) of the transmit uwave IF signal 6 at the input 8 is equal to the frequency range of the downstream uwave signal 7 at the output 9. Thus identical, but independently programmable, input and output local oscillators 36, 38 may be used to generate the signals LO1 and LO2. The oscillators 36, 38 have an operating frequency range of 3.2–4.05 GHz and a step size of 1.25 MHz. To minimize phase noise added by the frequency shifting and translation of the spectral segments 33 and 34, a reference signal having low phase noise is applied to reference input REF for phase locking the input local oscillator 36 and the output local oscillator 38.

Figure 3:
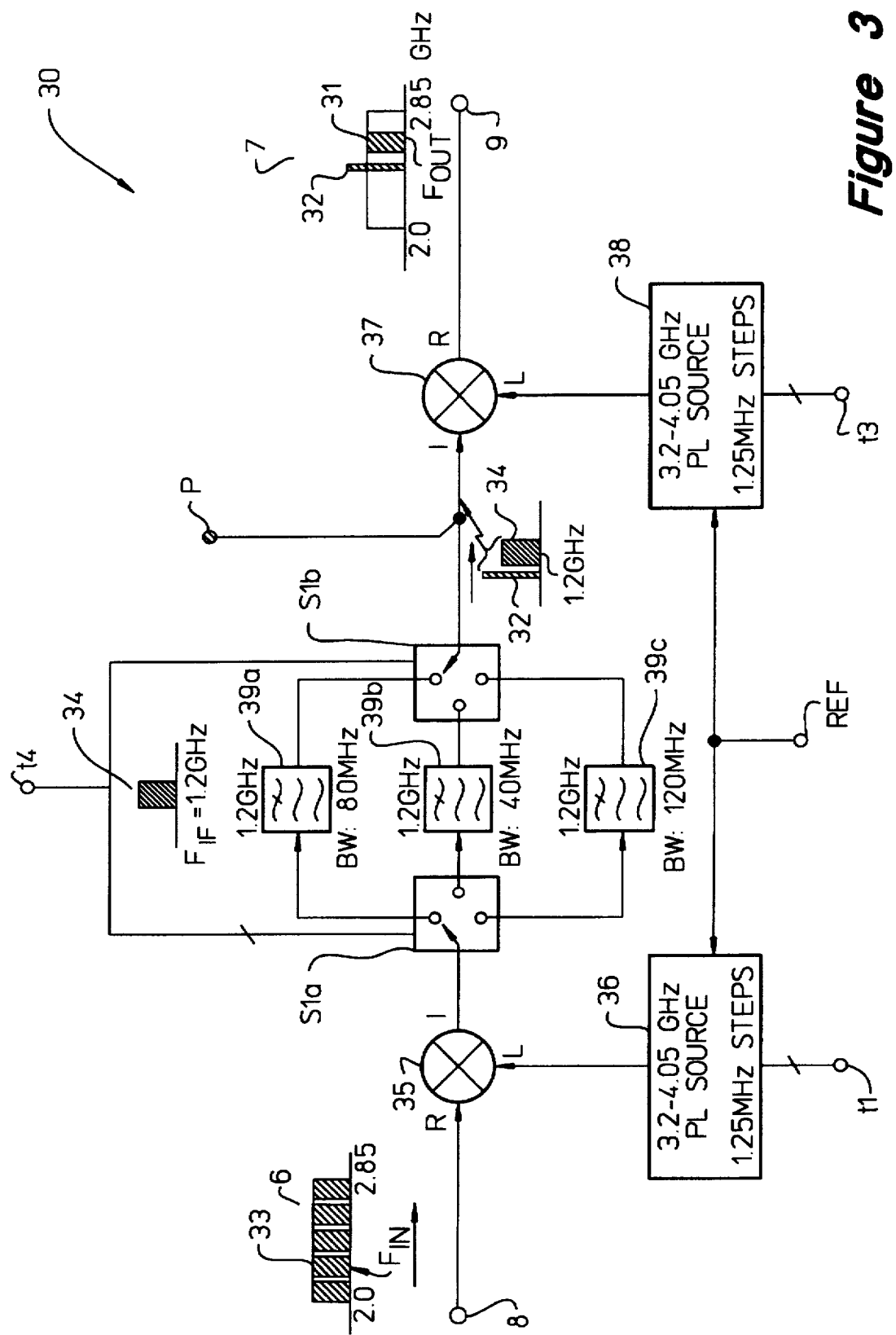
FIG. 3 shows the tPST of FIG. 2 including an attached pilot signal.

FIG. 3 shows the tPST 30 of FIG. 2, including an optionally attached pilot signal 32 (spectrum shown). Shifting of the spectral segment 33 that is to be selected from the frequency $F_{IN}$ to the predetermined IF frequency $F_{IF}$ (in this example 1.2 GHz), enables the pilot signal 32 or an additional service channel at the band edge of the selected spectral segment 34 to be attached to the selected spectral segment 34. Addition of the pilot signal 32 or service channel is optional, but if incorporated, these additional signals are simply applied to a pilot input P and summed with the spectral segment 34 at the I port of the output mixer 37. When the pilot signal 32 or service channel, and selected spectral segment 34 are translated in frequency using mixer 37, the frequency offset between the attached pilot signal 32 or service channel and the spectral segment 34 at the predetermined IF frequency $F_{IF}$ is maintained in the downstream uwave signal 7 at the output 9 of the tPST 30.

Figure 4:
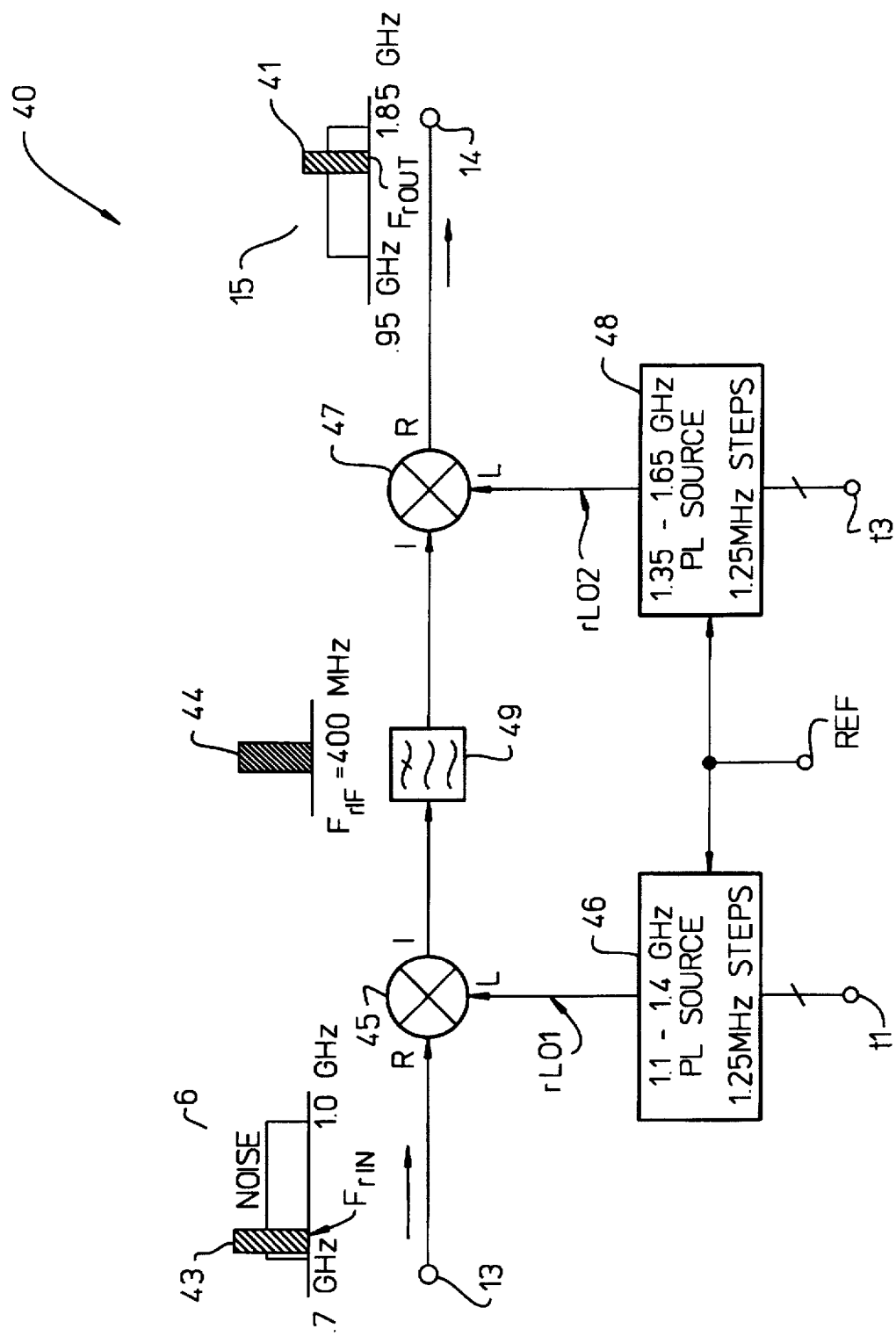
FIG. 4 shows a receive programmable band select/transfer module (rPST) constructed according to a second preferred embodiment of the present invention.

FIG. 4 shows a receive programmable band select/transfer module (rPST) 40 constructed according to the second preferred embodiment of the present invention. The upstream uwave IF signal 12 (spectrum shown) is generated from the downconverted received mmwave signal 24a (shown in FIG. 1) and is applied to an input 13 of the rPST 40. In this example, a 300 MHz bandwidth corresponding to the 31.0 to 31.3 GHz received mmwave signal 24a is downconverted to the upstream uwave signal 12 in the frequency range of 0.7 to 1.0 GHz. Typically, the 300 MHz band is divided into four received bands 43 each 75 MHz wide. One such band 43 is shown. The upstream uwave signal 12 is applied to the R port of a receive input mixer 45. The spectral position of the received band to be selected is disposed about an input frequency $Fr_{IN}$.

A signal rLO1 is generated from a receive input oscillator 46 programmed via control port r1 to produce an output frequency $Fr_{LO1}$ that is offset from the input frequency$_N$ Fr by a predetermined IF frequency $Fr_{IF}$. In this example the predetermined IF frequency $Fr_{IF}$=400 MHz. At the I port of the receive input mixer 45, the input frequency $FR_{IN}$ of the upstream uwave signal 12 is shifted so that the input frequency $FR_{IN}$ is equal to the predetermined IF frequency, $Fr_{IF}$. The spectral segment 43 to be selected from the shifted downstream uwave signal is then disposed about the predetermined IF frequency $Fr_{IF}$. The shifted band 44 of downstream uwave signal 12 is then applied to a bandpass filter 49. In this example the bandpass filter 49 is implemented with a surface acoustic wave (SAW) filter having a 75 MHz bandwidth and high selectivity.

The SAW filter 49 selects the 75 MHz wide band or spectral segment 44 disposed about the IF frequency $FR_{IF}$. The spectral segment 44 is applied to the I port of a receive output mixer 47. A signal rLO2 is generated from a receive output oscillator 48 programmed via control port r3 to produce a frequency $Fr_{LO2}$. The signal rLO2 is applied to the L port of the receive output mixer 47 which translates the selected spectral segment 44 to a designated spectral position $Fr_{OUT}$ in the received uwave IF signal 15 at the rPST's output 14. The spectral segment of the applied upstream uwave signal 12 originally disposed about input frequency $Fr_{IN}$ is translated by programming the frequency of the receive output local oscillator 48. In this example, the frequency range (0.7–1.0 GHz) of the upstream uwave signal 12 at the input 13 and the frequency range (0.95–1.25 GHz) of the received uwave IF signal 15 at the output are different. Thus, the frequency range of the receive input oscillator 46 (1.1–1.4 GHz) and the frequency range of the receive output oscillator 48 (1.35–1.65 GHz) in the rPST 40 are different. Both oscillators 46, 48 have a 1.25 MHz frequency adjustment step size.

The selection of a spectral segment 44 by the SAW filter 49 reduces noise present in the received uwave IF signal 12 that would otherwise degrade the upstream uwave IF signal 12 when combined with the upstream uwave IF signals of the other segments. Noise outside the bandwidth of the selected spectral segment 44 is filtered by the SAW filter 49 in the rPST 40. The receive input oscillator 46 and receive output oscillator 48 are phase locked to a reference signal (not shown) that is applied to reference input REF. The phase noise added by the frequency shifting and translation of the selected spectral segment 43 is minimized by using a reference signal that has low phase noise.

Typically, both the tPST 30 and rPST 40 modules are integrated into each sector 15a–15d in the basemodule 5 of a LMDS basestation 10 (as shown in FIG. 1). The modules may be implemented on a printed circuit board enabling the modules to have low manufacturing cost. Since the filtering in each module 30, 40 takes place at a predetermined IF frequency, the filters 39a–39c, 49 can be optimized to have precisely defined amplitude flatness, group delay and selectivity, tailored to system requirements of the LMDS. Selection of spectral segments having different bandwidths is readily accommodated in the rPST 40 or tPST 30 modules by adding filters with the desired bandwidths, in parallel with the filters already present in the modules, or by replacing filters in the modules.

In the tPST 30, adjustments to the frequency ranges of the transmit uwave IF signal 6 applied to the input 8 and downstream uwave signal 7 generated at the tPST output 9 are readily accommodated by adjusting the tuning ranges of the input oscillator 36 and output oscillator 38 in the tPST 30. Similarly, in the rPST 40, adjustments to the frequency ranges of the upstream uwave signal 12 applied to the rPST input 13 and received uwave IF signal 15 generated by the rPST output 14 are readily accommodated by adjusting the tuning ranges of the input local oscillator 46 and output local oscillator 48 in the rPST 40. Therefore in both the rPST 40 and tPST 30, the spectral position of the selected spectral segment at the modules' outputs are independently programmable relative to the positions of the spectral segments at the modules' inputs.

What is claimed is:

1. A programmable band select/transfer module for a Local Multipoint Distribution Service, at a module input receiving a plurality of spectral segments having a predetermined spectral segment disposed about an input frequency and at a module output transmitting the predetermined spectral segment disposed about a predefined output frequency, the module comprising:

a first programmable oscillator generating a first signal at a first frequency;

a first mixer coupled to the first programmable oscillator and to the module input, having a first input port receiving the first signal, having a second input port receiving the plurality of spectral segments, and having a first output port, the first mixer shifting the input frequency to dispose the predetermined spectral segment of the plurality about an IF frequency at the first output port;

filter means coupled to the first output port, having a passband disposed about the IF frequency selecting the predetermined spectral segment from the plurality of spectral segments, the filter means including multiple filters, the passband of each filter of the multiple filters having a different bandwidth;

a second programmable oscillator generating a second signal at a second frequency;

a second mixer having a first input coupled to the filter means and having a second input coupled to the second oscillator, the first input receiving the predetermined spectral segment from the filter means, the second input receiving the second signal, the second mixer having a second output port coupled to the module output, the second mixer translating the IF frequency to an output frequency to dispose the predetermined spectral segment about the predetermined output frequency, at the second output port;

a first switch coupled between the first output port and the filter means; and a second switch coupled between the filter means and the first input of the second mixer, the first switch and the second switch alternately coupling one of the multiple filters to the first output port of the first mixer and the first input of the second mixer.

2. The module of claim 1 wherein the predetermined spectral segment is positioned within the passband of the filter means by programming the first oscillator to adjust the first frequency to equal the input frequency plus the IF frequency and the predetermined spectral segment is disposed about the predefined output frequency by programming the second oscillator to adjust the second frequency to equal the predefined output frequency plus the IF frequency wherein the first programmable oscillator and the second programmable oscillator are independently programmable, the module further comprising a pilot input coupled to the first input of the second mixer, the pilot input receiving one of a pilot signal and a service channel, applied to the pilot input.

3. The module of claim 1 wherein the predetermined spectral segment is positioned within the passband of the filter means by programming the first oscillator to adjust the first frequency to equal the input frequency plus the IF frequency.

4. The module of claim 3 wherein the predetermined spectral segment is disposed about the predefined output frequency by programming the second oscillator to adjust the second frequency to equal the predefined output frequency plus the IF frequency.

5. The module of claim 4 wherein the first programmable oscillator and the second programmable oscillator are independently programmable.

6. The module of claim 1 further comprising an interface coupled to the module input, generating the plurality of spectral segments disposed about the input frequency.

7. A method for selecting a predetermined spectral segment disposed about an input frequency from a plurality of spectral segments and for disposing the predetermined spectral segment about an output frequency, the method comprising the steps of:

receiving the plurality of spectral segments from one of an interface and an antenna module;

shifting the input frequency to an IF frequency to dispose the predetermined spectral segment about the IF frequency;

filtering the predetermined spectral segment from the plurality of spectral segments disposed about the IF frequency with a filter having a passband and selecting one of multiple filters when the spectral segments are received from the interface, each of the multiple filters having a fixed passband of a different bandwidth;

translating the IF frequency to an output frequency to dispose the predetermined spectral segment about the predefined output frequency;

transmitting the predetermined spectral segment disposed about the predefined output frequency to the interface when the plurality of spectral segments are received from the antenna module; and transmitting the predetermined spectral segment disposed about the predefined output frequency to the antenna module when the plurality of spectral segments are received from the interface.

8. The method of claim 7 further comprising the step of adding a pilot signal to the predetermined spectral segment about the IF frequency when the plurality of spectral segments is received from the interface.

9. The method of claim 7 further comprising the step of adding a service channel to the predetermined spectral segment about the IF frequency when the plurality of spectral segments is received from the interface.

10. A sector for a basestation of a Local Multipoint Distribution Service, coupling an interface to an antenna module, the sector comprising:

a transmit programmable band select/transfer module, receiving from the interface a first plurality of spectral segments having a first spectral segment of the first plurality of spectral segments disposed about a first input frequency and transmitting to the antenna module the first spectral segment disposed about a first output frequency; and a receive programmable band select/transfer module, receiving from the antenna module a second plurality of spectral segments having a second spectral segment of the second plurality of spectral segments disposed about a second input frequency and transmitting to the interface the second spectral segment disposed about a second output frequency, the receive programmable band select/transfer module and the transmit programmable band select/transfer module each including, a first programmable oscillator generating a first signal at a first frequency, a first mixer coupled to the first programmable oscillator and one of the interface and the antenna module, having a first input port receiving the first signal, having a second input port receiving one of the first and the second spectral segments, and having a first output port, the first mixer shifting one of the first and the second spectral segments to dispose the one of the first and the second spectral segments about an IF frequency at the first output port, filter means coupled to the first output port, having a passband disposed about the IF frequency selecting one of the first and second spectral segments disposed about the IF frequency, a second programmable oscillator generating a second signal at a second frequency, and a second mixer coupled to the filter means and to the second oscillator, the second mixer having a first input receiving one of the first and the second selected spectral segments disposed about the IF frequency, having a second input receiving the second signal, and having a second output port, the second mixer translating the IF frequency to one of the first and the second output frequency to dispose the one of the first and the second selected spectral segments about one of the first and the second output frequencies at the second output port; wherein the filter means of the transmit programmable band select/transfer module includes multiple filters, each of the multiple filters having a passband of a different bandwidth, the transmit programmable band select/transfer module having a first switch coupled between the first output port and the filter means, and a second switch coupled between the filter means and the first input of the second mixer, the first switch and the second switch alternately coupling one of the multiple filters to the first output port of the first mixer and the first input of the second mixer.

* * * * *